United States Patent [19]
Cliff et al.

[11] Patent Number: 5,258,668
[45] Date of Patent: Nov. 2, 1993

[54] PROGRAMMABLE LOGIC ARRAY INTEGRATED CIRCUITS WITH CASCADE CONNECTIONS BETWEEN LOGIC MODULES

[75] Inventors: Richard G. Cliff, Milpitas; Bahram Ahanin, Cupertino, both of Calif.

[73] Assignee: Altera Corporation, San Jose, Calif.

[21] Appl. No.: 880,888

[22] Filed: May 8, 1992

[51] Int. Cl.$^5$ ............................................ H03K 19/177
[52] U.S. Cl. .................................. 307/465; 307/465.1
[58] Field of Search .......................... 307/465, 465.1; 340/825.83, 825.85, 825.87

[56] References Cited

U.S. PATENT DOCUMENTS

| | | | |
|---|---|---|---|
| 3,473,160 | 10/1969 | Wahlstrom | 340/172.5 |
| 4,642,487 | 2/1987 | Carter | 307/465 |
| 4,684,830 | 8/1987 | Tsui et al. | 340/825.83 |
| 4,706,216 | 11/1987 | Carter | 365/94 |
| 4,727,268 | 2/1988 | Hori | 307/465 |
| 4,870,302 | 9/1989 | Freeman | 307/465 |
| 4,912,345 | 3/1990 | Steele et al. | 307/465 |
| 5,003,202 | 3/1991 | Keida | 307/465 |
| 5,121,006 | 6/1992 | Pedersen | 307/465 |
| 5,144,166 | 9/1992 | Camarota et al. | 307/465.1 |

OTHER PUBLICATIONS

E. J. McCluskey, "Iterative Combinational Switching Networks-General Design Considerations", IRE Transactions on Electronic Computers, Dec. 1958, 285-291.

R. C. Minnick, "A Survey of Microcellular Research", Journal of the Association for Computing Machinery, vol. 14, No. 2, pp. 203-241, Apr. 1967.

S. E. Wahlstrom, "Programmable Logic Arrays--Cheaper by the Millions", Electronics, Dec. 11, 1967, pp. 90-95.

*Recent Developments in Switching Theory*, A. Mukhopadhyay, ed., Academic Press, New York, 1971, chapters VI and IX, pp. 229-254 and 369-422.

*Primary Examiner*—Edward P. Westin
*Assistant Examiner*—Benjamin D. Driscoll
*Attorney, Agent, or Firm*—Robert R. Jackson

[57] ABSTRACT

A programmable logic array integrated circuit has a number of relatively simple logic modules which can be interconnected in any of a wide variety of ways via a general purpose interconnection network to enable the circuit to perform logic functions which can be quite complex. In addition, at least some of the logic modules are connectable to one another by cascade connections and include additional logic elements for logically combining the outputs of the cascade connected modules so that modules can be concatenated to perform relatively complex logic functions without always having to make use of the general purpose interconnection network.

8 Claims, 4 Drawing Sheets

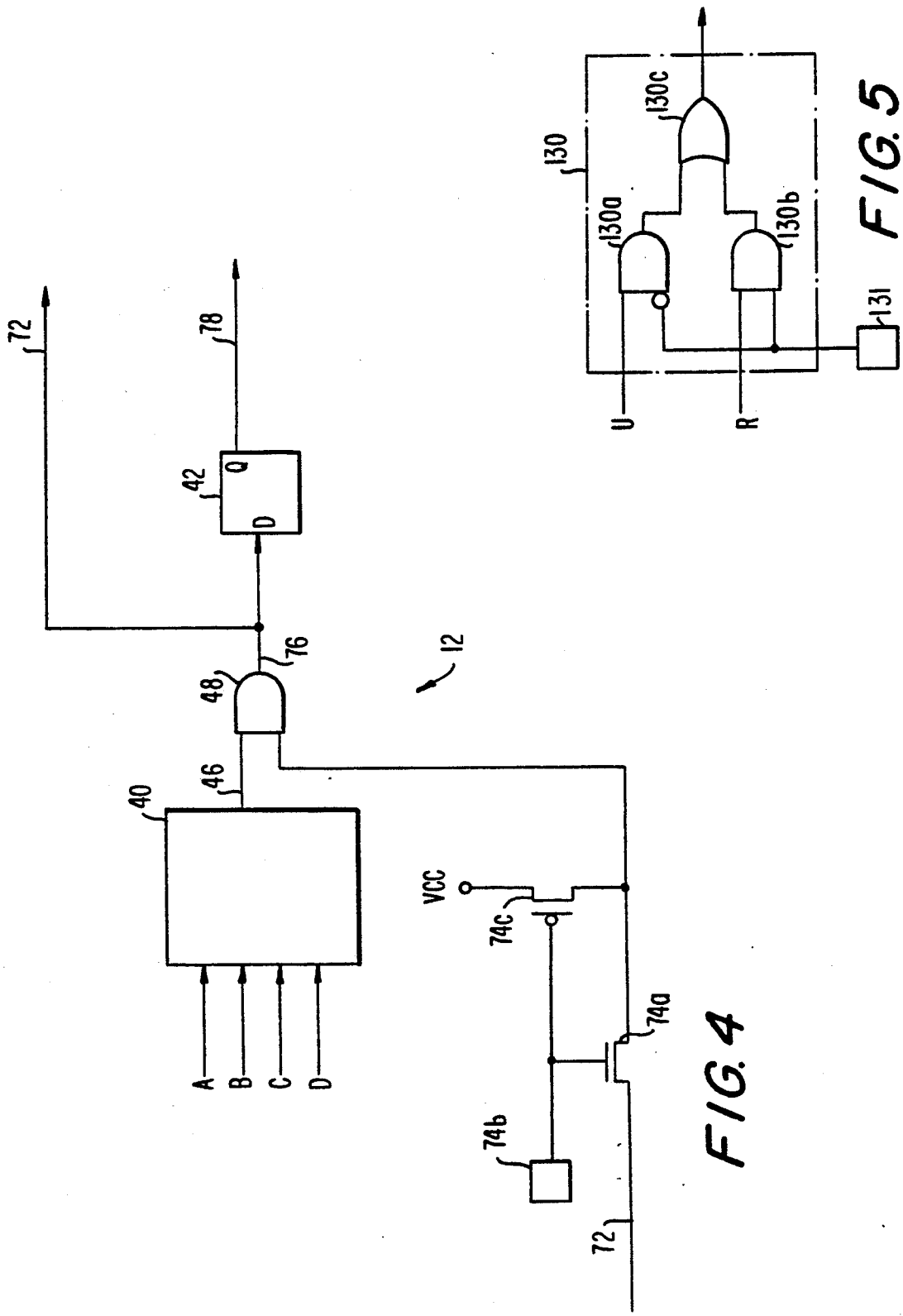

PROGRAMMABLE LOGIC ARRAY INTEGRATED CIRCUITS WITH CASCADE CONNECTIONS BETWEEN LOGIC MODULES

BACKGROUND OF THE INVENTION

This invention relates to programmable logic array integrated circuits, and more particularly to programmable logic array integrated circuits having improved interconnections between the individual logic modules in the circuit.

Commonly assigned, co-pending patent application Ser. No. 754,017, filed Sep. 3, 1991 (hereby incorporated by reference herein) shows programmable logic array integrated circuits which are highly modular. In the circuits shown in that application, very similar types of interconnection pathways are used for all types of interconnections between the logic modules. This tends to simplify the design of the circuit. It also tends to simplify the software and/or other techniques used to program the circuit to implement particular logic functions. Thus the circuits shown in the above-mentioned application have several important advantages.

There is always room for further improvement, however, and there are some situations in which the provision of additional or alternative types of interconnections between the logic modules would have benefits sufficient to justify the additional circuit and programming complexity. Such additional interconnection paths may be desirable for making frequently needed interconnections, for speeding certain kinds of interconnections, for allowing short distance interconnections to be made directly without tying up more general purpose and therefore long distance interconnection resources, etc. There is also a continuing demand for logic devices with larger capacity. This produces a need to implement logic functions more efficiently and to make better use of the portion of the device which is devoted to interconnecting individual logic modules.

Wahlstrom U.S. Pat. No. 3,473,160 shows cellular logic arrays having programmable logic cells CA1, CA2, CA3, CB1, etc., which are interconnectable in a general way by data buses or lines $X_{1B}$, $X_{1C}$, $Y_{12}$, and $Y_{13}$, and which are also interconnectable in a more limited way by leads such as $Z_L$, $Z_U$, and $Z_B$. Carter U.S. Pat. No. 4,642,487 shows the same kind of structure. However, in the Wahlstrom and Carter devices the special interconnection circuits merely duplicate connections which can be made through the general interconnect structure. The Wahlstrom and Carter special interconnection circuits may be faster than the general interconnect structure, and they may conserve general interconnect structure resources, but they do not add any capabilities to the circuit. For example, they do not facilitate the performance of more complex logic functions than can be performed by putting the same signals through the general interconnect structure rather than through the special interconnection circuits.

In view of the foregoing, it is an object of this invention to provide improved programmable logic array integrated circuits.

It is a more particular object of this invention to provide programmable logic array integrated circuits with additional possibilities for interconnections between the logic modules which are not mere duplications of interconnections which can be made through a general purpose interconnection network.

SUMMARY OF THE INVENTION

These and other objects of the invention are accomplished in accordance with the principles of the invention by providing programmable logic array integrated circuits in which the outputs of at least some logic modules can be directly combined with the outputs of other logic modules without making use of the general interconnect network which is provided for such purposes as allowing the output of one logic module to be connected as an input to another logic module. In a preferred embodiment, each logic module includes an additional logic element for forming a logical combination of the normal output signal of that logic module and the output signal from another, preferably adjacent, logic module. The output signal from the other logic module is preferably applied directly to the additional logical element in the first logic module without going through the general interconnect circuitry. The output signal of the additional logic element in each logic module becomes the output signal of that logic module. Any number of logic modules can be interconnected in this way (e.g., in a series or cascade) to produce logic functions of any desired complexity. Any cascade interconnections which are not needed can be gated off.

Further features of the invention, its nature and various advantages will be more apparent from the accompanying drawings and the following detailed description of the preferred embodiments.

BRIEF DESCRIPTION OF THE DRAWINGS

FIG. 4 is a schematic block diagram of a simpler and somewhat more specific embodiment of what is shown in FIG. 3.

FIG. 5 is a schematic block diagram of an illustrative embodiment of a portion of the circuit shown in FIG. 3.

DETAILED DESCRIPTION OF THE PREFERRED EMBODIMENTS

Figure 1:
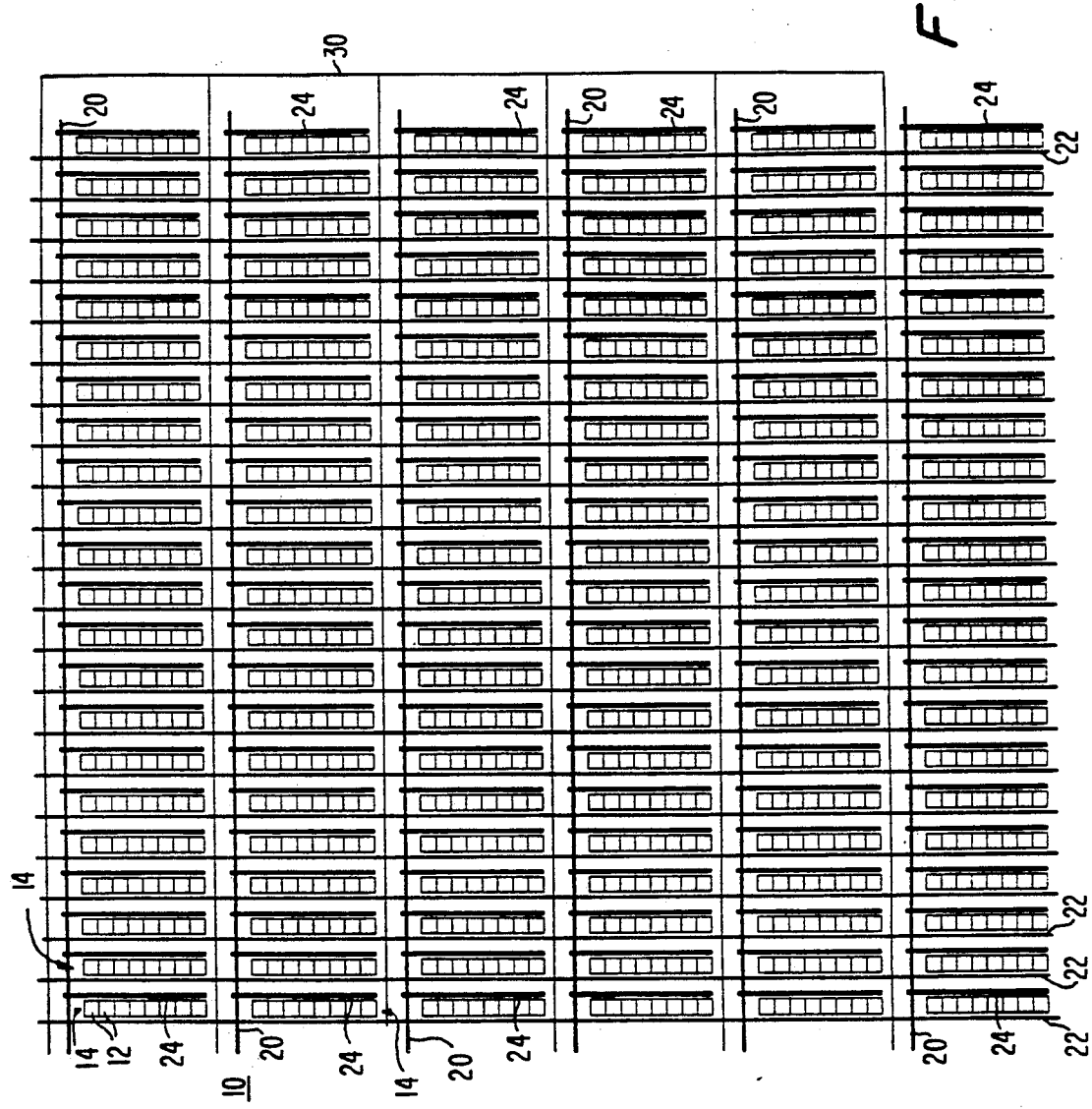
FIG. 1 is a simplified schematic block diagram of an illustrative programmable logic array integrated circuit which can include the present invention.

Although this invention can be practiced in the context of other types of programmable logic array integrated circuits, the invention will be fully understood from the following explanation of its application to programmable logic array integrated circuits of the kind shown in commonly assigned, copending application Ser. No. 07/880,942, filed May. 8, 1992, which is hereby incorporated by reference herein. As shown in FIG. 1 (which is substantially identical to FIG. 1 of the immediately above-mentioned application), a programmable logic array integrated circuit 10 has a large number of programmable logic modules 12. Each of logic modules 12 can perform a relatively simple logic function (e.g., form any logical combination of four inputs). Logic modules 12 are grouped together in groups of eight. Each such group is called a logic array block or LAB 14. LABs 14 are arranged in a two dimensional array on device 10. This array comprises six rows of 22 LABs per row.

A group of global horizontal conductors 20 is associated with each row of LABs 14. A group of global vertical conductors 22 is associated with each column of LABs 14. A signal on any global horizontal conductor 20 can be applied (via local conductors 24) to one or more logic modules 12 in the LAB row associated with that conductor. The output signal of each logic module 12 can be applied to a global horizontal conductor 20 associated with that module's LAB row, and also to one or two global vertical conductors 22 associated with that module's LAB column. The output of each logic module 12 can also be applied to other logic modules in that LAB via local conductors 26 (see FIG. 2, which is again substantially identical to FIG. 2 in the application mentioned immediately above). Global vertical conductors 22 are connectable to global horizontal conductors 20.

The conductors and connections described in the immediately preceding paragraph comprise the general interconnection circuitry of device 10. This general interconnection circuitry permits any logic module output to be connected to any logic module input so that device 10 can be programmed to perform large numbers of logic functions of almost any desired complexity.

Figure 3:
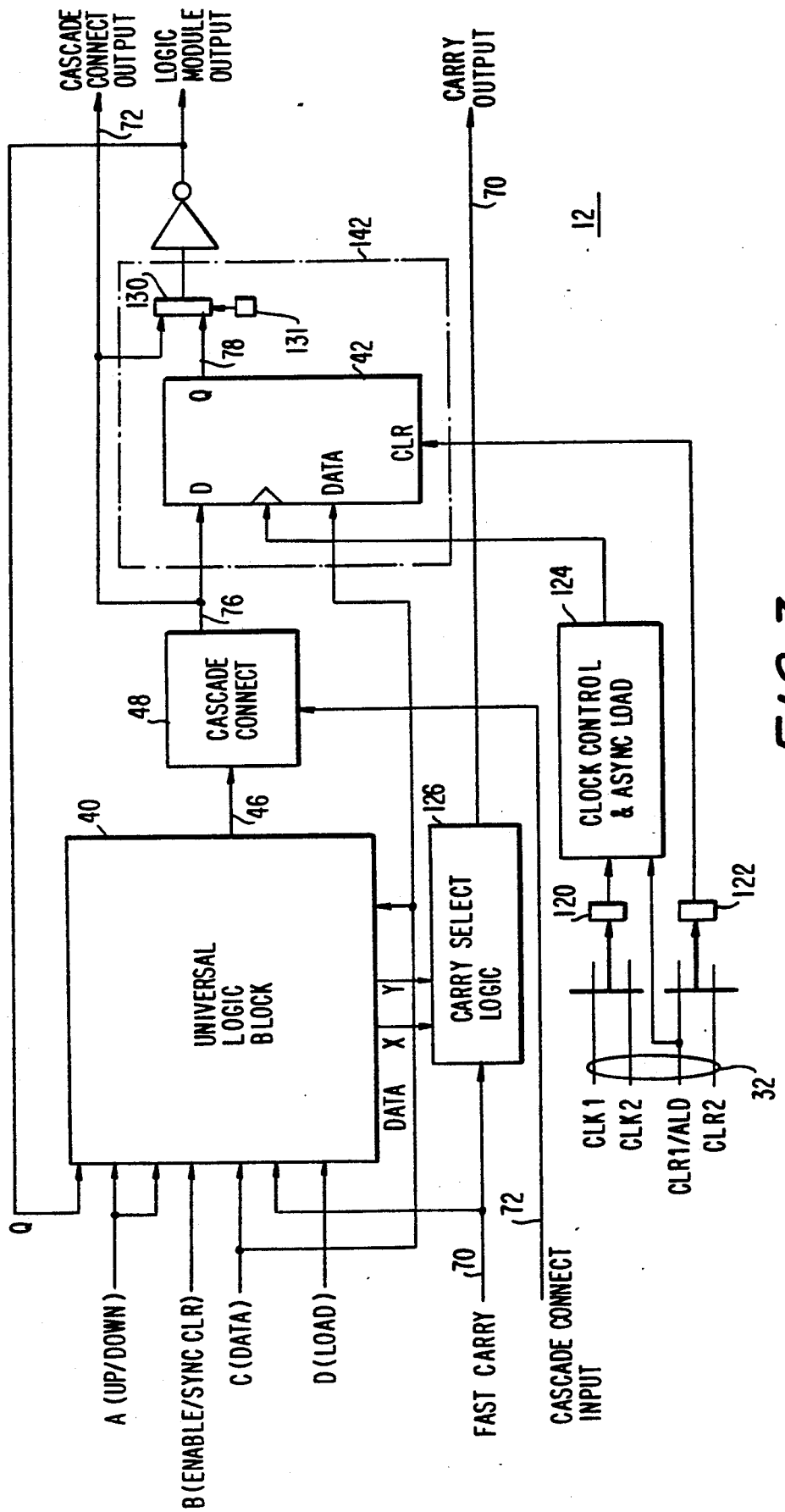
FIG. 3 is a still more detailed schematic block diagram of an illustrative embodiment of a representative portion of FIG. 2.

A typical logic module 12 suitable for use in above-described device 10 and also embodying the present invention is shown in FIG. 3. (FIG. 3 is substantially identical to FIG. 8 in above-mentioned application Ser. No 07/880,942.) As is described in the immediately above-mentioned application, universal logic block 40 is programmable to produce on output lead 46 an output signal which is one of several possible logical functions (preferably any possible logical function) of input signals A-D. To facilitate performing addition, subtraction, and/or counting, universal logic block 40 may also be programmable to produce one of several possible logical functions of certain of inputs A-D and inputs Q and/or FAST CARRY. Universal logic block 40 can be implemented in any of several ways, for example, as a look up table or a product-term-based macrocell. Details of several possible implementations of logic block 40 are given in the immediately above-mentioned application.

Output lead 46 is one input to cascade connect logic element 48. For example, logic element 48 may be a two-input AND gate. The other input to logic element 48 is the cascade connect output 72 from another, preferably adjacent, logic module 12 (see FIG. 2 which shows representative cascade connections 72a (between adjacent logic modules within an LAB) and 72b (between logic modules in adjacent LABs)). Assuming that this other input is active, logic element 48 logically combines it with the signal on lead 46 and applies the resulting output signal via lead 76 to the D input of flip-flop 42. The Q output signal of flip-flop 42 is one input to switch 130. The signal on lead 76 is the other input to switch 130.

Switch 130 is controlled by a conventional programmable function control element ("FCE") 131 to connect a desired one of its two inputs to its output. For example, FIG. 5 shows an illustrative embodiment of switch 130 including AND gates 130a and 130b and OR gate 130c. The output of FCE 131 is applied to one input of AND gate 130b, and is also applied in inverted form to one input of AND gate 130a. Accordingly, either input U or input R appears at the output of OR gate 130c, depending on the state of FCE 131. In this way, the output signal of cascade connect logic element 48 is passed by switch 130 either as registered by flip-flop 42 or unregistered by that flip-flop.

As is described in the immediately abovementioned application, FCE 131 can be implemented in any of several different ways, for example, as an SRAM, a DRAM, a cell of a first-in first-out ("FIFO") memory, an EPROM, an EEPROM, a function control register (as in Wahlstrom U.S. Pat. No. 3,473,160), a ferroelectric memory cell, a fuse (e.g., a laser fuse), an anti-fuse, or the like.

The output of switch 130 is inverted by the depicted inverter and thereby becomes the output signal of the logic module. The signal on lead 76 is also applied (via output lead 72) to the cascade connect input 72 of another, preferably adjacent, logic module 12. Accordingly, any number of logic modules 12 can be connected in series via cascade connect leads 72 to produce a logic function of considerable complexity. No general interconnect circuitry 20, 22, 24, 26, etc., is used, and the cascade connect input does not arrive at a logic module via an ordinary, general purpose input to the logic module. Rather the cascade connect input is preferably a special, dedicated input which is not connectable to the general interconnect circuitry and which is used to directly modify the output of the logic module receiving it. This both conserves general interconnect resources for other uses, and speeds the performance of certain logic functions because the cascade connection circuitry of this invention can be made faster than the general interconnect circuitry. The faster performance of the cascade connection circuitry is possible because this circuitry can be optimized (e.g., in terms of buffering) for one function, whereas the general interconnect circuitry must be able to perform under various loading conditions. For this and other reasons the cascade circuitry of this invention can perform certain logic functions such as large fan-in functions extremely efficiently. For example, with the cascade connections of this invention many eight-input functions can be performed in just two logic modules 12.

Figure 2:
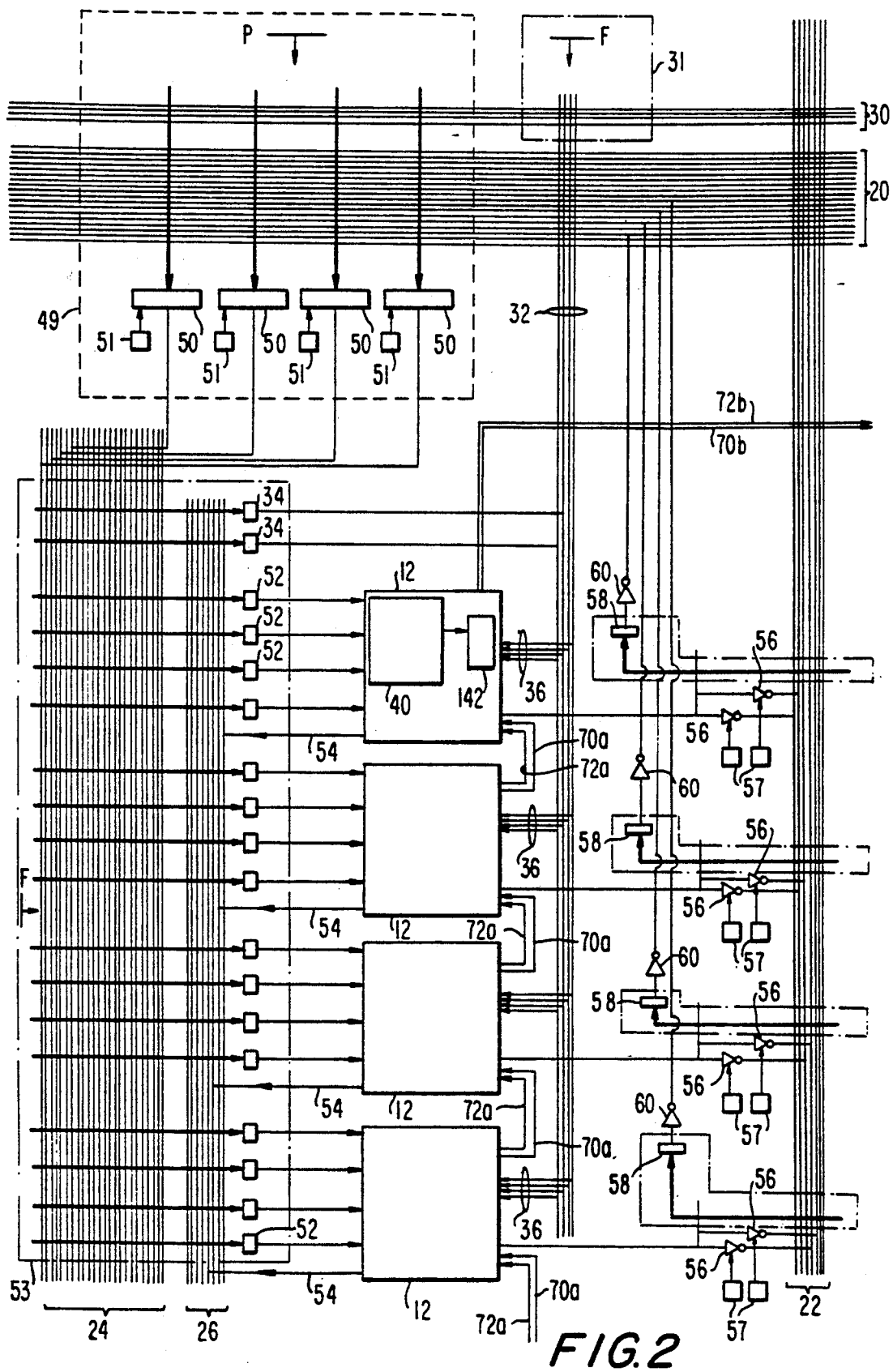
FIG. 2 is a more detailed schematic block diagram of an illustrative embodiment of a representative portion of the circuit of FIG. 1 showing an illustrative embodiment of the present invention.

The other circuitry shown in FIGS. 1-3 (e.g., elements 30, 32, 34, 36, 50-52, 54, 56-58, 60, 70, 110, 112, 114, 120, 122, 124, and 126) is not part of the present invention and therefore need not be described in detail here. These other elements are described in application Ser. No. 07/880,948.

FIG. 4 shows a somewhat simpler and more specific embodiment of the invention. FIG. 4 is more like FIG. 3 in application Ser. No. 07/880,942. As shown in FIG. 4, cascade connect input lead 72 is gated by elements 74a-c. Element 74b is an FCE (similar to above-described FCE 131) which is programmed to indicate whether or not the cascade connect input to depicted logic module 12 is desired. If so, FCE 74b is programmed to enable transistor 74a and to disable transistor 74c. This applies the cascade connect input signal to logic element 48, which in this case is a two-input AND gate. The other input to AND gate 48 is the output 46 of universal logic block 40. AND gate 48 applies the logical AND of its two inputs to lead 76. This becomes the cascade connect output signal on output lead 72 to the next logic module 12 in the chain of logic modules interconnected by cascade connections. The signal on lead 76 is also applied to flip-flop 42 and thereby becomes the output of the depicted logic module which can be applied to the general interconnection network.

If it is not desired to use cascade connect input 72, then FCE 74b is programmed to disable transistor 74a and to enable transistor 74c. This applies VCC (logical 1) to the second input terminal of AND gate 48, thereby allowing that gate to pass the output of logic block 40 to flip-flop 42 unaltered.

Although logic modules can be connected to one another by cascade connections as described above in any desired pattern, in a preferred embodiment adjacent logic modules 12 in each LAB 14 are connected to one another from the bottom to the top of the LAB as viewed in FIG. 1. Leads 72a in FIG. 2 are representative of this type of cascade connection of adjacent logic modules within a representative LAB. The cascade connect output from the topmost logic module in each LAB is then connected as the cascade connect input to the bottommost logic module in the LAB to the right of the first LAB as viewed in FIG. 1. Lead 72b in FIG. 2 is representative of this type of cascade connection between adjacent LABS.

It will be understood that the foregoing is merely illustrative of the principles of this invention, and that various modifications can be made by those skilled in the art without departing from the scope and spirit of the invention. For example, the type of logic element 48 can be changed if desired, the number of logic modules 12 in the cascade connect chain can be varied if desired, and the number of logic modules connected to each logic element 48 by cascade connections can also be changed if desired.

The invention claimed is:

1. A programmable logic array integrated circuit comprising:
  a plurality of substantially more than two programmable logic modules disposed on said circuit in a two-dimensional array, each of said logic modules having a plurality of input signal leads and at least one output signal lead for producing on said output signal lead an output signal which is substantially any logical function of the input signals on said input signal leads;
  a first plurality of conductors extending along a first dimension of said two-dimensional array;
  a second plurality of conductors extending along a second dimension of said two-dimensional array;
  a plurality of switches for making programmable connections between said output signal leads, said first and second conductors, and said input signal leads so that the output signal lead of substantially any of said logic modules can be connected to substantially any of said logic module input signals leads, each of said output signal leads being connectable to at least one of said conductors by said switches, each of said first conductors being connectable to a multiplicity of said second conductors by said switches, and each of said input signal leads being connectable to a multiplicity of said conductors by said switches;
  a plurality of auxiliary conductors, each of which is associated with a respective one of said logic modules so that a substantial majority of said logic modules have an associated auxiliary conductor, each of said auxiliary conductors connecting the output signal lead of the associated logic module to another receiving logic module which in a substantial majority of cases has an associated auxiliary conductor connecting its output signal lead to yet another receiving logic module, each of said auxiliary conductors making its connection between the associated logic module and the receiving logic module without making use of said first and second conductors or said input signal leads; and
  means associated with each receiving logic module and responsive to the signal received by said receiving logic module via an auxiliary conductor for selectively logically modifying the output signal on the output signal lead of said receiving logic module in accordance with the signal on said auxiliary conductor, wherein each receiving module produces an intermediate output signal which is substantially any logical function of said input signals of said receiving logic module, and wherein said means associated with said receiving logic module comprises:
  means for logically combining said intermediate output signal and the signal received by said receiving logic module via said auxiliary conductor to produce said output signal of said second logic module.

2. The circuit defined in claim 1 further comprising:
  gate means for selectively preventing the output signal of each logic module from being used by said means associated with each receiving logic module to modify the output signal of said receiving logic module.

3. The circuit defined in claim 2 further comprising:
  a programmable function control element for controlling said gate means.

4. The circuit defined in claim 1 wherein said means for logically combining comprises a logic gate.

5. The circuit defined in claim 4 wherein said logic gate comprises an AND gate.

6. The circuit defined in claim 1 wherein each of said receiving logic modules further comprises:
  flip-flop means for registering the output signal of said receiving logic module, the output signal of said means associated with each receiving logic module being applied as an input signal to the flip-flop means of said receiving logic module.

7. A programmable logic array integrated circuit comprising:
  a plurality of programmable logic modules, each of which has a plurality of inputs and at least one output for producing as said output a programmable logical function of said inputs;
  a network of conductors for programmably connecting the output of substantially any of said logic modules to substantially any of said logic module inputs;
  an auxiliary conductor for connecting the output of a first of said logic modules to a second of said logic modules; and
  means associated with said second logic module for selectively logically modifying the output of said second logic module in accordance with the signal on said auxiliary conductor, wherein each of said logic modules comprises:
  a universal logic block for producing an intermediate output which is said programmable logical function of said inputs, said intermediate output of said second logic module being applied to said means associated with said second logic module for modification in accordance with said signal on said auxiliary conductor;
  flip-flop means for registering the output of said logic module, the output of said means associated with said second logic module being applied as an input to the flip-flop means of said second logic module; and means for selectively allowing the output of said means associated with said second logic module to bypass the flip-flop means of said second logic module.

8. A programmable logic array integrated circuit comprising:

a plurality of programmable logic modules, each of which has a plurality of inputs and at least one output for producing as said output a programmable logical function of said inputs;

a network of conductors for programmably connecting the output of substantially any of said logic modules to substantially any of said logic module inputs;

an auxiliary conductor for connecting the output of a first of said logic modules to a second of said logic modules; and means associated with said second logic module for selectively logically modifying the output of said second logic module in accordance with the signal on said auxiliary conductor, wherein said means associated with said second logic module comprises an AND gate for logically combining the signal on said auxiliary conductor and the output of said second logic module.

* * * * *